(12) United States Patent
von Malm et al.

(10) Patent No.: US 8,716,724 B2
(45) Date of Patent: May 6, 2014

(54) OPTOELECTRONIC PROJECTION DEVICE (75) Inventors: Norwin von Malm, Nittendorf-Thumhausen (DE); Klaus Streubel, Laaber (DE); Patrick Rode, Regensburg (DE); Karl Engl, Niedergebraching (DE); Lutz Höppel, Alteglofsheim (DE); Jürgen Moosburger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 277 days.

(21) Appl. No.: 13/127,328

(22) PCT Filed: Nov. 27, 2009

(86) PCT No.: PCT/DE2009/001694
§ 371 (c)(1),
(2), (4) Date: May 26, 2011

(87) PCT Pub. No.: WO2010/072191
PCT Pub. Date: Jul. 1, 2010

(65) Prior Publication Data
US 2011/0241031 A1    Oct. 6, 2011

(30) Foreign Application Priority Data
Dec. 23, 2008   (DE) .................. 10 2008 062 933

(51) Int. Cl.
*H01L 33/62* (2010.01)
(52) U.S. Cl.
USPC .......................................... 257/88

(58) Field of Classification Search
USPC ................. 257/79–103, 431–448, E31.003
See application file for complete search history.

(56) References Cited

U.S. PATENT DOCUMENTS

| | | | |
|---|---|---|---|
| 5,940,683 A | 8/1999 | Holm et al. | |
| 6,633,134 B1 | 10/2003 | Kondo et al. | |
| 7,436,000 B2 * | 10/2008 | Kim et al. | 257/98 |
| 2002/0113246 A1 | 8/2002 | Nagai et al. | |
| 2008/0191215 A1 * | 8/2008 | Choi et al. | 257/76 |
| 2010/0171135 A1 | 7/2010 | Engl et al. | |
| 2010/0238417 A1 | 9/2010 | Streppel et al. | |

FOREIGN PATENT DOCUMENTS

| | | |
|---|---|---|
| DE | 102007022947 | 10/2008 |
| DE | 102008003451 | 2/2009 |
| DE | 102008011848 | 9/2009 |
| DE | 102008033705 | 10/2009 |
| JP | 2004-311677 | 11/2004 |
| JP | 2005-173238 | 6/2005 |
| WO | 01/97295 | 12/2001 |
| WO | 2006/061728 | 6/2006 |
| WO | 2008/060053 | 5/2008 |

* cited by examiner

*Primary Examiner* — Cuong Q Nguyen
(74) *Attorney, Agent, or Firm* — DLA Piper LLP (US)

(57) ABSTRACT

An optoelectronic projection device which generates a predefined image during operation, including a semiconductor body having an active layer that generates electromagnetic radiation and a radiation exit side and is an imaging element of the projection device, wherein, to electrically contact the semiconductor body, a first contact layer and a second contact layer are arranged at a rear side of the semiconductor body, the rear side lying opposite the radiation exit side, and are electrically insulated from one another by a separating layer.

14 Claims, 5 Drawing Sheets

OPTOELECTRONIC PROJECTION DEVICE

RELATED APPLICATIONS

This is a §371 of International Application No. PCT/DE2009/001694, with an international filing date of Nov. 27, 2009 (WO 2010/072191 A1, published Jul. 1, 2010), which is based on German Patent Application No. 10 2008 062 933.2 filed Dec. 23, 2008, the subject matter of which is incorporated by reference.

TECHNICAL FIELD

This disclosure relates to an optoelectronic projection device comprising a semiconductor body, which is an imaging element of the projection device.

BACKGROUND

WO 2008/060053 A1 discloses a device comprising an array of SiN-based LEDs arranged on a silicon substrate, wherein the LEDs are arranged in a two-dimensional regular matrix composed of n rows and m columns and are interconnected with one another. The LEDs each have a contact-connection on a front side and on a rear side, wherein the front side of the LEDs is in each case embodied as a radiation exit side. This disadvantageously results in shading effects at the radiation exit side of the LEDs which lead to an inhomogeneous emission characteristic of the LEDs.

An array of LEDs is furthermore described in WO 2001/097295 A2. Cylindrical LEDs arranged in a regular fashion are detached from an InGaN wafer. These LEDs are also electrically contact-connected from a front side and a rear side, thus disadvantageously resulting in shading effects and an associated inhomogeneous emission characteristic.

It could therefore be helpful to provide an optical projection device which is particularly space-saving and at the same time flexible in respect of how it can be used.

SUMMARY

An optoelectronic projection device which generates a predefined image during operation, comprising a semiconductor body having an active layer that generates electromagnetic radiation and a radiation exit side and is an imaging element of the projection device, wherein, to electrically contact the semiconductor body, a first contact layer and a second contact layer are arranged at a rear side of the semiconductor body, the rear side lying opposite the radiation exit side, and are electrically insulated from one another by a separating layer.

DETAILED DESCRIPTION

This object is achieved, inter alia, by means of an optoelectronic projection device comprising the features of patent claim 1. The dependent claims relate to advantageous embodiments and preferred developments of the projection device.

We provide an optoelectronic projection device which generates a predefined image during operation. The projection device comprises a semiconductor body, which has an active layer suitable for generating electromagnetic radiation and a radiation exit side. The semiconductor body is an imaging element of the projection device. For making electrical contact with the semiconductor body, a first contact layer and a second contact layer are arranged at a rear side of the semiconductor body, the rear side lying opposite the radiation exit side, and are electrically insulated from one another by a separating layer.

The first and second contact layers arranged at the rear side of the semiconductor body advantageously prevent shading effects that can arise as a result of a contact layer arranged on the radiation exit side of the semiconductor body. Overall, the radiation efficiency of the semiconductor body and also the radiation homogeneity are improved as a result.

The semiconductor body is an imaging element of the projection device. In particular, the image generated by the projection device during operation is not generated by a further element such as, for example, a stencil, a transparency or a light modulator such as, for example, an LCD panel or a micromirror array, rather the semiconductor body itself is the imaging element. An optoelectronic projection device which is distinguished, in particular, by space-saving properties and at the same time is flexible in respect of how it can be used is advantageously made possible. In particular, a miniaturized projection device thus arises.

The semiconductor body is, for example, a light-emitting diode chip or a laser diode chip. The semiconductor body is preferably a thin-film semiconductor body. In the context of the application, a thin-film semiconductor body is considered to be a semiconductor body during whose production the growth substrate, onto which a semiconductor layer sequence comprising the semiconductor body was grown, for example epitaxially, has been stripped away.

The active layer of the semiconductor body preferably has a pn junction, a double heterostructure, a single quantum well (SQW) or a multi-quantum well structure (MQW) for generating radiation. In this ease, the designation quantum well structure does not exhibit any significance with regard to the dimensionality of the quantization. It therefore encompasses, inter alia, quantum wells, quantum wires and quantum dots and any combination of these structures.

The semiconductor body has a radiation exit side, through which radiation generated in the semiconductor body can leave the semiconductor body. In this case, the radiation exit side is preferably formed by a main side of the semiconductor body. In particular, the radiation exit side is formed by that main side of the semiconductor body which lies opposite a mounting side of the semiconductor body. Preferably, no or hardly any light emerges through side areas of the semiconductor body.

Preferably, the optoelectronic projection device generates a predefined image during operation. In particular, during the operation of the projection device, the latter generates an image which is predefined and hence predetermined. The image can be imaged onto a projection area, for example.

The semiconductor body is provided for emitting electromagnetic radiation from the radiation exit side. A first and a second electrical contact layer are arranged at the rear side lying opposite the radiation exit side. The first and the second electrical contact layer are electrically insulated from one another by a separating layer.

It is not absolutely necessary for the entire first and/of second electrical contact layer to be arranged at the rear side. Rather, a partial region of the first contact layer extends from the rear side through a perforation in the active layer in the direction toward the radiation exit side. The separating layer is arranged between the first contact layer and the second contact layer, wherein preferably the first contact layer and the second contact layer overlap laterally in a plan view of the semiconductor body.

Advantageously, the radiation exit side of the semiconductor body is free of electrical connection locations such as bonding pads, for example. The risk of shading and/or absorption of part of the radiation emitted by the active layer during operation by the electrical connection locations is minimized in this way.

Furthermore, it is advantageously possible to dispense with complicated method steps in conjunction with the production of such connection locations arranged on the/radiation exit side, and/or measures which restrict or prevent the current injection into regions of the semiconductor body below the electrical connection location. By way of example, preferably polishing of the front-side surface of the semiconductor body and/or production of metal webs for current spreading which have a large thickness but a small lateral extent are/is not absolutely necessary. Furthermore, it is advantageously possible to dispense with, for example, the formation of an electrically insulating layer, a Schottky barrier and/or an ion-implanted region below the connection location.

Preferably, the second contact layer is structured in the form of pixels, wherein at least one part of the predefined image arises as a result of the projection of the pixels during the operation of the projection device.

Preferably, the completely predefined image arises as a result of the projection of the pixels. The second contact layer can be damaged in places, corresponding to the pixels, such that damaged regions do not conduct, current or hardly conduct current any longer. Regions of the second contact layer which are damaged do not or hardly energize the active layer. In this way, only selected regions of the active layer are luminous. These selected regions of the active layer which generate light are responsible for the formation of the predefined image. In this case, the structuring of the second contact layer can be effected by removal in places, ion implantation or diffusion of dopants into the second contact layer in places.

Preferably, the pixels are arranged in a two-dimensional segment display. Preferably, the pixels are arranged in a two-dimensional seven-segment display.

In particular, in this way only regions of the radiation exit side of the semiconductor body below which a pixel with the second contact layer is arranged in a vertical direction contribute to the emission of radiation. Only selected regions of the active layer which are arranged vertically above the second contact layer, in particular the pixels of the second contact layer, are luminous in this case.

Further preferably, the pixels are arranged in a two-dimensional regular matrix composed of n rows and m columns.

Further preferably, the second contact layer has at least one structure in the form of a pictogram, character, letter or lettering. Preferably, the second contact layer has a plurality of structures in each case in the form of a pictogram, character, letter or lettering.

In particular, each structure of the second contact layer is an already complete pictogram or character The projection of a plurality of characters, character strings and/or letterings is advantageously made possible in this way.

Preferably, the semiconductor body is structured to form a pattern, wherein at least one part of the predefined image arises as a result of the projection of the pattern during the operation of the projection device.

Particularly preferably, the complete predefined image arises as a result of the projection of the pattern.

The structuring of the semiconductor body to form a pattern can be effected by an etching method, for example, wherein the pattern to be produced is defined by a lithographic method. By way of example, for this purpose the semiconductor body can be completely removed in places. However, it is also possible for only parts of the semiconductor body, such as current-conducting layers, for example, to be removed. Overall, the pattern to be represented as an image arises through the regions of the radiation exit side of the semiconductor body which emit light during operation after the completion of the semiconductor body, in particular after the structuring of the semiconductor body has been effected.

If, by way of example, a luminous star is intended to be represented as an image by the optoelectronic projection device, then the semiconductor body can be completely removed apart from a star-shaped region. The star-shaped region is then luminous during the operation of the semiconductor body. In this case, the semiconductor body is the imaging element, wherein the pattern is formed by the star. In particular, an organic light-emitting diode (OLED) structured to form a pattern can be employed in this case.

The generation of light is thus advantageously concentrated on the selectively luminous regions of the semiconductor body.

Preferably, a reflective material is arranged in the removed regions of the semiconductor body. Examples of appropriate reflective materials include metals, for example Ag, or materials having a low refractive index, for example $SiO_2$. As a result, radiation emitted from the selectively luminous regions of the semiconductor body in the direction of the respective adjacent selectively luminous regions of the semiconductor body can be reflected at the reflective materials in the direction of the radiation exit side and can be coupled out there. In particular, the efficiency of the projection device is advantageously improved in this way.

In addition, optical crosstalk between the individual selectively luminous regions of the semiconductor body can advantageously be prevented. Optical crosstalk should be understood to mean, in particular, the emission of radiation from a selectively luminous region of the semiconductor body into an adjacent switched-off selectively luminous region. The consequence of optical crosstalk is a reduced contrast of the projection device. The reflective material thus advantageously improves the contrast of the projection device and also the efficiency of the projection device.

Preferably, the first contact layer is arranged at that side of the second contact layer which is remote from the semiconductor body. Particularly preferably, the second contact layer has a plurality of openings through which the first contact layer runs to the semiconductor body.

In particular, an electrically insulating separating layer is arranged between the first contact layer and the second contact layer. The electrically insulating separating layer preferably has, in the regions of the openings in the second contact layer, openings through which the first contact layer runs. In particular, the first contact layer is arranged in a manner electrically insulated from the second contact layer. The first contact layer accordingly runs in a manner electrically insulated from the second contact layer through the openings in the second contact layer to the semiconductor body. This can preferably be realized through the electrically insulating separating layer.

Preferably, a partial region of the first contact layer extends from the rear side through a perforation in the active layer in the direction toward the radiation exit side.

Particularly preferably, that partial region of the first contact layer which runs through the openings in the separating layer and the second contact layer runs from the rear side through the perforation in the active layer in the direction toward the radiation exit side. Preferably, the first contact layer runs in a manner electrically insulated from the semiconductor body in the semiconductor body to the perforation of the active layer.

In a further example, the first contact layer has at least one electrical connection region suitable for making electrical contact with the semiconductor body at a side of the active layer which faces the radiation exit side. In particular, the first contact layer is suitable, by the partial regions leading from the rear side through the perforation in the active layer in the direction toward the radiation exit side, for making electrical contact with the semiconductor body at that side of the active layer which faces the radiation exit side.

In particular, the connection region is arranged at the rear side of the semiconductor body. As a result, shading and/or absorption of the radiation emitted by the active layer in the connection region can advantageously be avoided.

Preferably, the first contact layer is structured in the form of structures and has a plurality of electrical connection regions, wherein a structure is in each case electrically conductively connected to a connection region.

In particular, separate electrical driving of the structures of the first contact layer is thus possible. By suitable electrical driving of the individual structures of the first contact layer, different images can thus advantageously be generated, in particular with one and the same semiconductor body. Through corresponding energization of the semiconductor body, the structures of the first contact layer can be energized independently of one another. In this way, with a single semiconductor body, different predefinable images can be generated independently of one another.

Further preferably, the second contact layer is structured in the form of pixels and has a plurality of electrical connection pads, wherein a pixel is in each case electrically conductively connected to a connection pad.

The individual pixels can thus be electrically driven separately from one another. Independent energization of the pixels of the second contact layer is made possible in this way, as a result of which different predefinable images can be generated independently of one another.

Particularly preferably, the first contact layer is structured in the form of structures and the second contact layer is structured in the form of pixels, wherein preferably the structures of the first contact layer and the pixels of the second contact layer can be electrically driven separately from one another. Independent energization of the regions of the first and second contact layers is thus possible, as a result of which, with a single semiconductor body, different predefinable images can be generated independently of one another. A flexible optoelectronic projection device is advantageously made possible.

Preferably, radiation coupling-out structures are arranged in regions on the radiation exit side of the semiconductor body.

In particular, radiation coupling-out structures are arranged only on the regions of the radiation exit side of the semiconductor body below which a respective pixel of the second contact layer is arranged in a vertical direction. This improves the radiation coupling-out of the radiation emitted by the semiconductor body in selected regions of the semiconductor body which are arranged vertically above the second contact layer, in particular above the pixels of the second contact layer. The selected regions of the radiation exit side correspond to the regions of the semiconductor body responsible for forming the predefined image.

The coupling-out of the radiation emitted by the semiconductor body is advantageously improved in regions of the radiation exit side which have radiation coupling-out structures as a result of which the efficiency of the semiconductor body is advantageously increased.

At the interface of the semiconductor body, a jump in the refractive index takes place from the material of the semiconductor body, on the one hand, to the surrounding material, on the other hand. This results in refraction of the light at the transition from the semiconductor body into the surroundings. Depending on the angle at which a ray of light impinges on the interface, total reflection can occur. On account of the parallel surfaces of the semiconductor body, the reflected ray of light impinges on the opposite interface at the same angle, such that total reflection occurs there as well. The consequence is that the ray of light Can therefore contribute nothing to the emission of light. By virtue of the fact that radiation coupling-out structures are arranged on the radiation exit side, the angle at which a ray of light impinges on the surface is altered.

Radiation coupling-out structures should primarily be understood to mean surface structurings. In particular, improved coupling-out of light can be made possible for instance by a height profile of the radiation exit side, for example, a microprism structuring, or an increase in the roughness of the radiation exit side. If roughenings of the radiation exit side are provided, an irregular surface that improves the coupling-out of light is formed as a result.

Preferably, a wavelength conversion element is disposed downstream of the semiconductor body on the radiation exit side. In particular, at least part of the light emerging through the radiation exit side of the semiconductor body thus passes through the wavelength conversion element, whereby the radiation of one wavelength that is emitted by the semiconductor body is at least partly converted into radiation of another wavelength. As a result, it is advantageously possible to produce a projection device which emits multicolored light.

Particularly advantageously, a semiconductor body has a plurality of adjacent selectively luminous regions, wherein a regular arrangement of wavelength conversion elements is arranged on the radiation exit side. In particular, the regular arrangement preferably comprises a green emitting conversion element on each first selectively luminous region, a red emitting conversion element on each second selectively luminous region, and no conversion element on each third selectively luminous region. A green or red emitting conversion element should be understood to mean, in particular, a conversion element which converts radiation emitted by the semiconductor body into radiation in the green or in the red wavelength range, respectively.

A full-color semiconductor body which can project full-color images in the projection device can thus advantageously he produced.

The structuring of the different conversion elements can be effected for example by the etching of optical semiconductor materials, for example II-VI semiconductor materials, or by partial, lithographic lift-off, the so-called lift-off method, of ceramic conversion materials deposited beforehand. Ablation of conversion layers by laser irradiation is also possible.

Preferably, an optical element is disposed downstream of the semiconductor body on the radiation exit side. In particular, at least part of the light that is generated by the semiconductor body and emerges through the radiation exit side of the semiconductor body thus passes through the optical element and is optically influenced by the latter.

The optical element is preferably a radiation-directing element arranged in the beam path of the semiconductor body for the purpose of directing the radiation emitted by the active layer onto a projection area. The optical element intended for projecting the light emitted by the semiconductor body onto a projection area can consist, for example, of one or a plurality of lenses, in particular a lens system. In this case, the lenses or the lens system can each have one or two curved areas. The lens or the lens system can be fixed directly on the semiconductor body. Alternatively, the lens or the lens system can be arranged at a defined distance from the semiconductor body. In this case, the defined distance can be produced by an outer frame that frames the semiconductor body.

Depending on the desired application of the projection device, The lens Or the lens system can be shaped in such a way that an image to scale of the radiation emitted by the semiconductor body is produced on a planar or curved projection area perpendicularly, parallel or diagonally with respect to the radiation exit side of the semiconductor body.

The projection device may comprise an optical element formed by an outer area of a potting body surrounding the semiconductor body. In particular, the semiconductor body is surrounded by a potting material, which can be, for example, a silicone, an epoxy resin or hybrid materials composed of silicone and epoxy resin. The potting material can envelop the semiconductor body in a positively locking manner at least in places. The potting body has an outer area shaped in the manner of a projection lens.

The formation of the potting body as an optical element for the projection device enables the projection device advantageously to have just two elements. The semiconductor body is used as an imaging element. The potting of the semiconductor body is used as a projection optical unit. By virtue of the lens shape of the potting body, the losses on account of reflections at the interface between the potting body and the surrounding material, for example air, are reduced further. In particular, the coupling-out of light is advantageously increased by virtue of the shaping of the outer area of the potting body.

Preferably, the first and/or the second contact layer reflect (s) part of the electromagnetic radiation, the part being emitted from the active layer in the direction toward the rear side, in the direction of the radiation exit side.

If, by way of example, the second contact layer is structured in the form of pixels and embodied in a reflective fashion, then the light emitted by the semiconductor body appears brighter where the second contact layer is situated than in adjoining regions. In this way, it is possible to generate an image distinguished by the fact that the pixels in the image are represented more brightly than the surrounding regions.

Preferably, the projection device is part of an electronic component, in particular of a mobile telephone, PDA, laptop, computer, clock or alarm clock.

Preferably, the electronic component is a portable component. A portable component is distinguished, in particular, by the fact that it saves space. In particular, the component has a smallest possible component size.

Particularly preferably, the electronic component has a projection area. The projection area is thus formed, in particular, within the electronic component. The image generated during the operation of the projection device can be imaged onto the projection area within the electronic component by back projection.

Alternatively, the projection area can lie outside the electronic component. In this case, the projection area can be, for example, a table, a wall or a housing part of the electronic component.

Further features, advantages and preferred examples of the optoelectronic projection device will become apparent from the description below in conjunction with FIGS. 1 to 3.

Identical or identically acting constituent parts are in each case provided with the same reference symbols. The constituent parts illustrated and also the size relationships of the constituent parts among one another should not be regarded as true to scale.

FIGS. 1A to 1F in each case show a schematic cross section of a projection device having a semiconductor body 1. The semiconductor body 1 is, for example, a light-emitting diode chip or a laser diode chip. The semiconductor body 1 is preferably in thin-film design and comprises epitaxially deposited layers that form the semiconductor body 1.

The layers of the semiconductor component are preferably based on a III-V compound semiconductor material. A III-V compound semiconductor material comprises at least one element from the third main group such as, for example Al, Ga, In and one element from the fifth main group such as, for example, N, P, As. In particular, the term III-V compound semiconductor material encompasses the group of binary, ternary and quaternary compounds which contain at least one element from the third main group and at least one element from the fifth main group, in particular nitride and phosphide compound semiconductors. Moreover, such a binary, ternary or quaternary compound can comprise, for example, one or a plurality of dopants and additional constituents.

The semiconductor body 1 has an active layer 101 suitable for generating electromagnetic radiation. The active layer 101 preferably comprises a pn junction, a double heterostructure, a single quantum well or a multi-quantum well structure for generating radiation. The active layer 101 of the semiconductor body 1 preferably emits radiation in the ultraviolet or infrared or particularly preferably in the visible wavelength range. For this purpose, the active layer 101 of the semiconductor body 1 can comprise InGaAlP or InGaN, for example.

The semiconductor body 1 furthermore has a radiation exit side 102, at which the electromagnetic radiation generated in the active layer 101 emerges from the semiconductor body 1.

The semiconductor body 1 is an imaging element of the projection device. In particular, the image generated by the projection device during operation is not generated by a further element such as, for example, a stencil, a transparency or a light modulator, rather the semiconductor body 1 itself is the imaging element of the projection device. A space-saving projection device is advantageously made possible in this way.

To make electrical contact with the semiconductor body 1, a first contact layer 2 and a second contact layer 3 are arranged at a rear side 103 lying opposite the radiation exit side 102 of the semiconductor body 1 and are electrically insulated from one another by a separating layer 4.

Preferably, the second contact layer 3 is structured in the form of pixels 301, wherein at least one part of the predefined image 10 arises as a result of the projection of the pixels 301 during the operation of the projection device. By way of example, the pixels 301 of the second contact layer 3 can be structured in a two-dimensional segment display, in particular a seven-segment display, or in a two-dimensional regular matrix composed of n rows and m columns.

Alternatively, the second contact layer 3 can have at least one structure in the form of a pictogram, character, letter or lettering. Preferably, the second contact layer 3 has a plurality of structures in the form of a pictogram, character, letter or lettering.

Preferably, regions 305 of the second contact layer 3 which are arranged between the pixels 301 are electrically insulating. In particular, the pixels 301 are electrically insulated from one another by the regions 305.

Preferably, the electrical conductivity of the regions 305 of the second contact layer 3 outside the pixels 301 is destroyed or at least reduced. Alternatively, the second contact layer 3 can be removed in regions outside the pixels 301. In this case, electrically insulating material, for example dielectric material, is arranged between the pixels 301.

The first contact layer 2 is preferably arranged at that side of the second contact layer 3 which is remote from the semiconductor body 1. Preferably, an electrically insulating separating layer 4 is arranged between the first contact layer 2 and the second contact layer 3.

The second contact layer 3 and the electrically insulating separating layer 4 preferably have a plurality of openings 302 through which the first contact layer 2 runs to the semiconductor body 1. That partial region 203 of the first contact layer 2 which leads to the openings 302 extends from the rear side 103 of the semiconductor body 1 through a perforation 104 in the active layer 101 in the direction toward the radiation exit side 102. The first contact layer 2 is thus suitable for making electrical contact with the semiconductor body 1 at a side of the active layer 101 which faces the radiation exit side 102. The second contact layer 3 is suitable for making electrical contact with the semiconductor body 1 from the rear side 103 thereof.

In this example, the first contact layer 2 is therefore connected to the epitaxial layer of the semiconductor body 1 at points via electrically insulated openings or perforations. In particular, the partial regions 203 of the first contact layer 2 which are led through the openings 302 in the second contact layer 3 and through the semiconductor body 1 are led in a manner electrically insulated from the first contact layer 3 and the layers of the semiconductor body 1. This can be realized through the electrically insulating separating layer 4b, for example.

The first and/or second contact layer 2, 3 can contain a metal or a metal alloy. The electrically insulating separating layer 4 can contain dielectric layers, for example.

The first contact layer 2 is preferably a planar mirror extending virtually over the entire lateral extent of the semiconductor body 1. Preferably, the first contact layer 2 is an n-type contact of the semiconductor body 1.

The second contact layer 3 is preferably arranged on partial regions of the semiconductor body 1. Consequently, the second contact layer 3 does not extend over the entire lateral extent of the semiconductor body 1. Preferably, the second contact layer 3 is a p-type contact of the semiconductor body 1.

Preferably, the first and/or the second contact layer 2, 3 are/is reflective to the radiation emitted by the active layer 101.

Particularly preferably, the second contact layer 3 is reflective. This increases the coupling-out of radiation in the imaging regions of the semiconductor body, as a result of which the radiation efficiency preferably increases in the regions.

In the example in FIGS. 1A to 1F, the first contact layer 2 has an electrical connection region suitable for making electrical contact with the semiconductor body 1 (not illustrated). The second contact layer 3 preferably has a plurality of electrical connection pads (not illustrated), wherein a pixel 301 is in each case electrically conductively connected to a connection pad. Consequently, the pixels 301 of the second contact layer 3 can be electrically driven separately from one another by the plurality of electrical connection pads.

By the second contact layer 3 structured to form pixels, during the operation of the projection device, the image to be imaged in the projection device is generated directly by a laterally selective emission in the semiconductor body 1. Different patterns can thus be generated by suitable driving of the pixels 301 of the second contact layer 3. In particular, by corresponding driving, differently luminous images such as, for example, pictograms, letters and/or letterings can be generated and imaged onto a projection area by a lens system.

Advantageously, during the operation of the projection device, a single semiconductor body 1 can thus represent a plurality of predefined images which, in particular, can be generated independently of one another. A projection device which can be used flexibly is advantageously made possible.

Figure 1A:
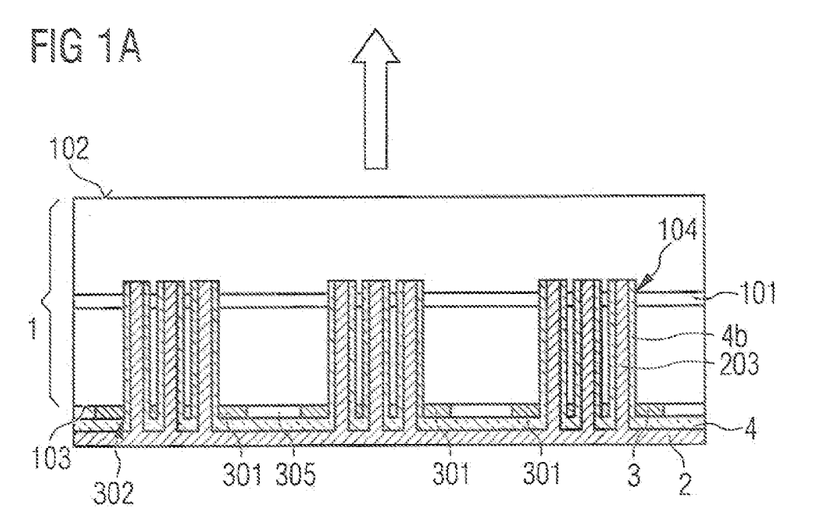
FIGS. 1A to 1F in each case show a schematic cross section of an example of a projection device.
Figure 1B:
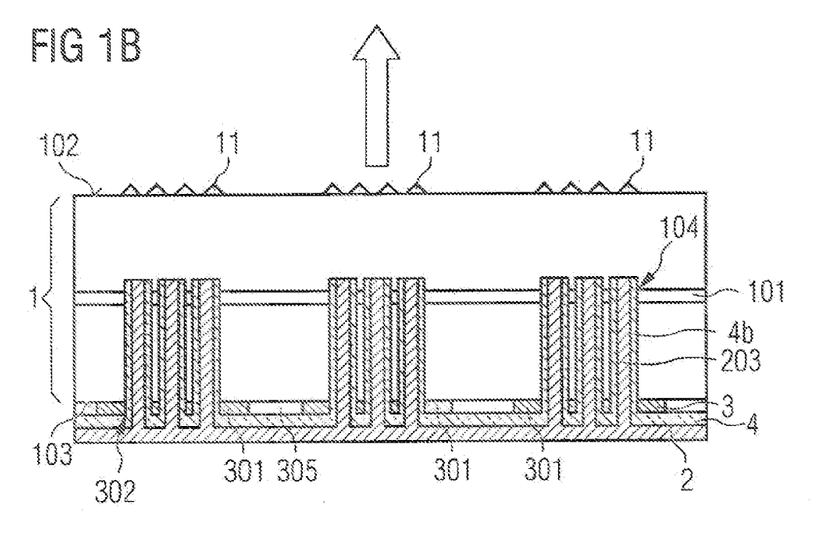

FIG. 1B shows a schematic cross section of a further projection device. In addition to the example illustrated in FIG. 1A, radiation coupling-out structures 11 are formed on the radiation exit side 102 of the semiconductor body 1. In particular, the radiation coupling-out structures 11 are arranged in regions on the radiation exit side 102.

In particular, radiation coupling-out structures 11 are arranged, only oh the regions of the radiation exit, side 102 of the semiconductor body 1 below which a pixel 301 of the second contact layer 3 is arranged in a vertical direction. There is an improvement in the radiation coupling-out of the radiation emitted by the semiconductor body 1 in selected regions of the semiconductor body 1 arranged vertically above the second contact layer 3, in particular above the pixels 301 of the second contact layer 3. The selected regions of the radiation exit side 102 correspond to the regions of the semiconductor body 1 responsible for forming the predefined image 10.

The coupling-out of the radiation emitted by the semiconductor body 1 is advantageously improved in regions of the radiation exit side 102 which have radiation coupling out structures 11, as a result of which the efficiency of the semiconductor body 1 is advantageously increased.

At the interface of the semiconductor body 1, a jump in the refractive index takes place from the material of the semiconductor body 1, on the one hand, to the surrounding material, on the other hand. This results in refraction of the light at the transition from the semiconductor body 1 into the surroundings. Depending on the angle at which a ray of light impinges on the interface, total reflection can occur. On account of the parallel surfaces of the semiconductor body 1, the reflected ray of light impinges on the opposite interface at the same angle, such that total reflection occurs there as well. The consequence is that the ray of light can therefore contribute nothing to the emission of light. By virtue of the fact that radiation coupling out structures 11 are arranged on the radiation exit side 102, the angle at which a ray of light impinges on the surface is altered.

Radiation coupling-out structures 11 should primarily be understood to mean surface structurings. In particular, improved coupling-out of light can be made possible for instance by a height profile of the radiation exit side 102, for example a microprism structuring or an increase in the roughness of the radiation exit side 102. If roughenings of the radiation exit side 102 are provided, an irregular surface that improves the coupling-out of light is formed as a result.

For the rest, the example in FIG. 1B corresponds to the example in FIG. 1A.

Figure 1C:
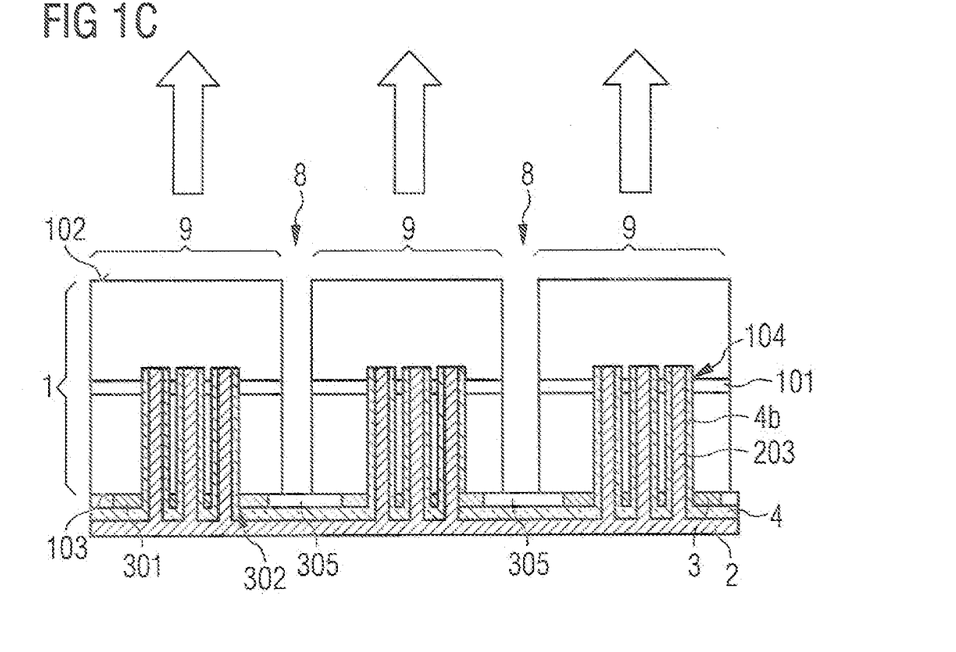

FIG. 1C shows a schematic cross section of a further projection device. In contrast to the example in FIG. 1A, the semiconductor body 1 is structured from a pattern, wherein at least one part of the predefined image 10 arises as a result of the projection of the pattern during the operation of the projection device.

Preferably, the complete predefined image 10 arises as a result of the projection of the pattern of the semiconductor body 1.

In this case, the structuring of the semiconductor body 1 to form a pattern can be effected by an etching method, for example, wherein the pattern 10 to be produced is defined by a lithographic method. By way of example, for this purpose, the semiconductor body can be particularly removed in places. The pattern to be represented as an image 10 thus arises through the regions of the radiation exit side 102 of the semiconductor body 1 which emit light during operation after the completion of the semiconductor body 1, in particular after the structuring of the semiconductor body 1 has been effected.

If, by way of example, a strip pattern is intended to be represented as an image by the optoelectronic projection device, then the semiconductor body 1 can be completely removed in regions, in particular illustrated as removed regions 8 in FIG. 1C. During the operation of the semiconductor body 1, the strip-shaped regions 9 are then luminous. The semiconductor body 1 is the imaging element, wherein the pattern is formed by the strips.

In particular, an organic light-emitting diode (OLED) structured to form a pattern can be employed in this case.

In this configuration, the generation of light is advantageously concentrated on the selectively luminous regions of the semiconductor body 1.

For the rest, the example in FIG. 1C corresponds to the example in FIG. 1A.

Figure 1D:
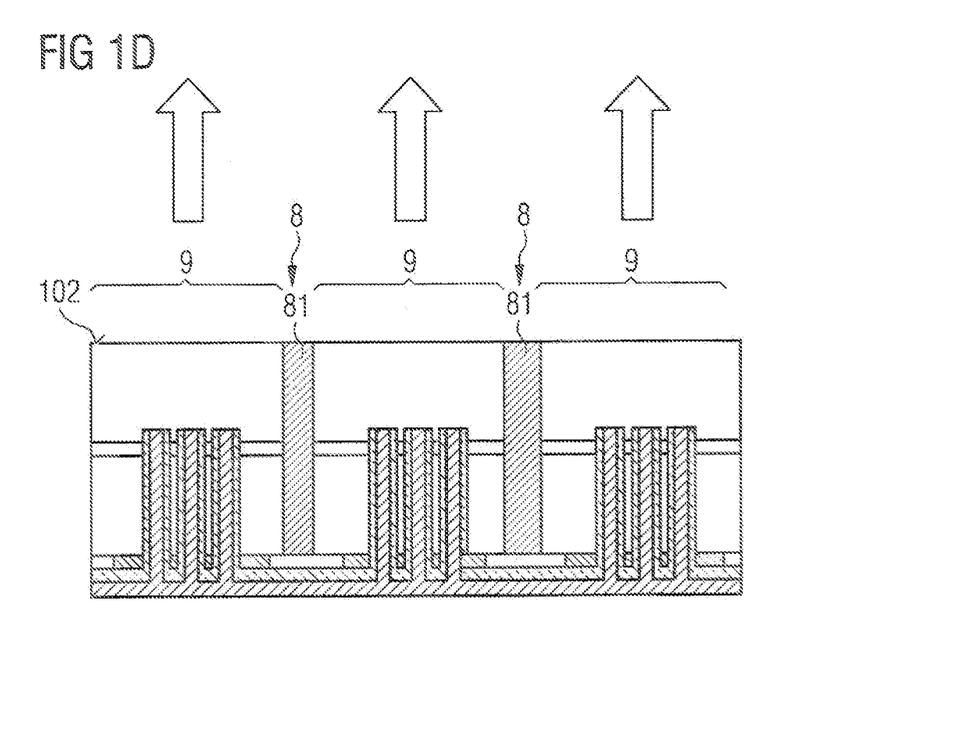

FIG. 1D shows a schematic cross section of a further projection device. In contrast to the example in FIG. 1C, the removed regions 8 are filled with a reflective material 81. Examples of appropriate reflective materials 81 include metals, for example Ag, or materials haying a low refractive index, for example $SiO_2$. As a result, radiation emitted from the individual strip-shaped regions 9 in the direction of the respective adjacent strip-shaped regions 9 can be reflected at the reflective materials 81 in the direction of the radiation exit side 102 and can be coupled out there. In particular, the efficiency of the projection device is advantageously improved in this way.

In addition, optical crosstalk between the individual regions 9 can advantageously be prevented. The reflective material 81 thus advantageously improves the contrast of the projection device and also the efficiency of the projection device.

For the rest, the example in FIG. 1D corresponds to the example in FIG. 1C.

Figure 1E:
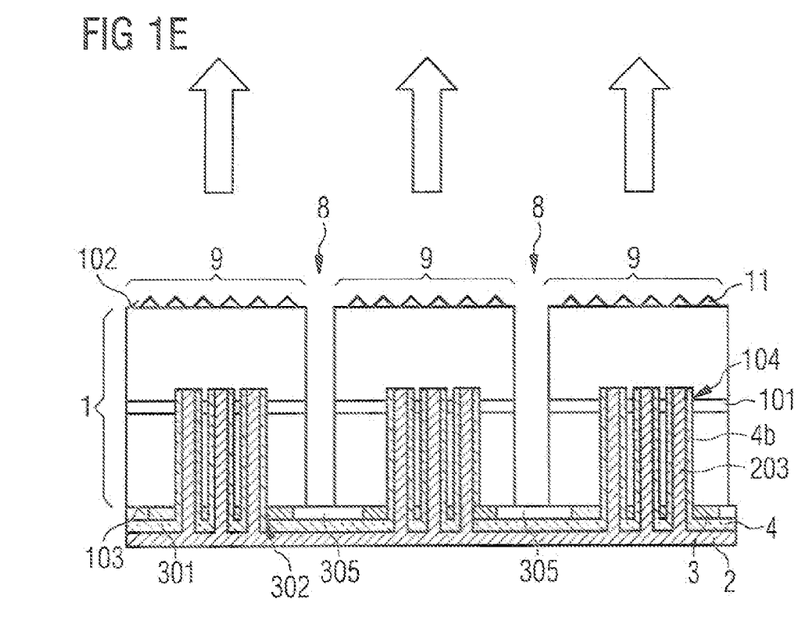

FIG. 1E illustrates a further example of a further projection device. In contrast to the example illustrated in FIG. 10, in the example shown in FIG. 1E, radiation coupling-out structures 11 are arranged on the radiation exit side 102. In this case, the radiation coupling-out structures 11 are arranged in the regions 9 of the radiation exit side 102 of the semiconductor body below which a pixel 301 of the second contact layer 3 is arranged in a vertical direction.

The radiation coupling-out structures 11 advantageously improve the coupling-out of the radiation emitted by the semiconductor body 1, as a result of which the efficiency of the semiconductor body 1 is advantageously increased.

For the rest, the example in FIG. 1E corresponds to the example in FIG. 1C.

Figure 1F:
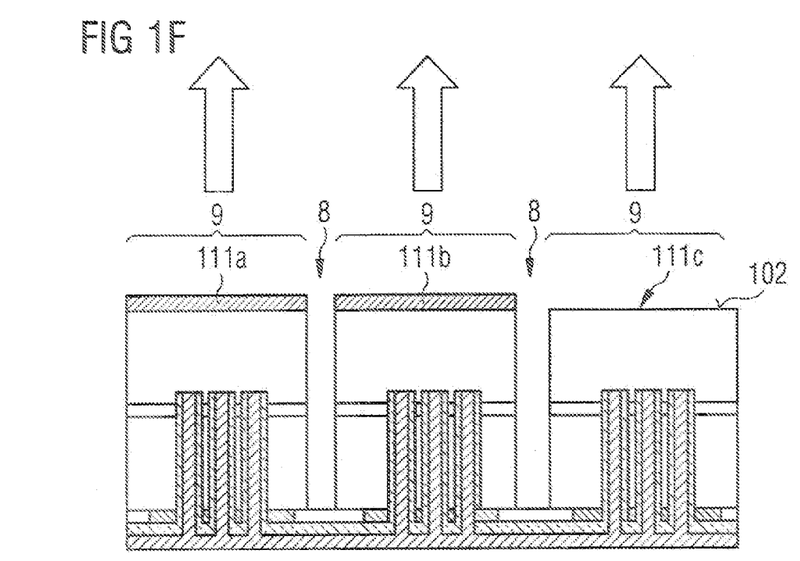

FIG. 1F illustrates a further example of a further projection device. In contrast to the example illustrated in FIG. 1E, instead of the radiation coupling-out structures, wavelength conversion elements 111 are arranged on the radiation exit side 102. By way of example, a green emitting conversion element 111a is arranged on a first region 9 of the semiconductor body, a red emitting conversion element 111b is arranged on a second region 9 of the semiconductor body, and no conversion element in the region 111c is arranged on a third region 9 of the semiconductor body. As a result, a full-color semiconductor body which can project full-color images in the projection device can advantageously be produced.

For the rest, the example in FIG. 1F corresponds to the example in FIG. 1E.

FIGS. 2A to 2G in each case show longitudinal sections along a lateral extent of a projection device. In particular, the first contact layer 2 and the second contact layer 3 are illustrated in a detailed manner.

Figure 2A:
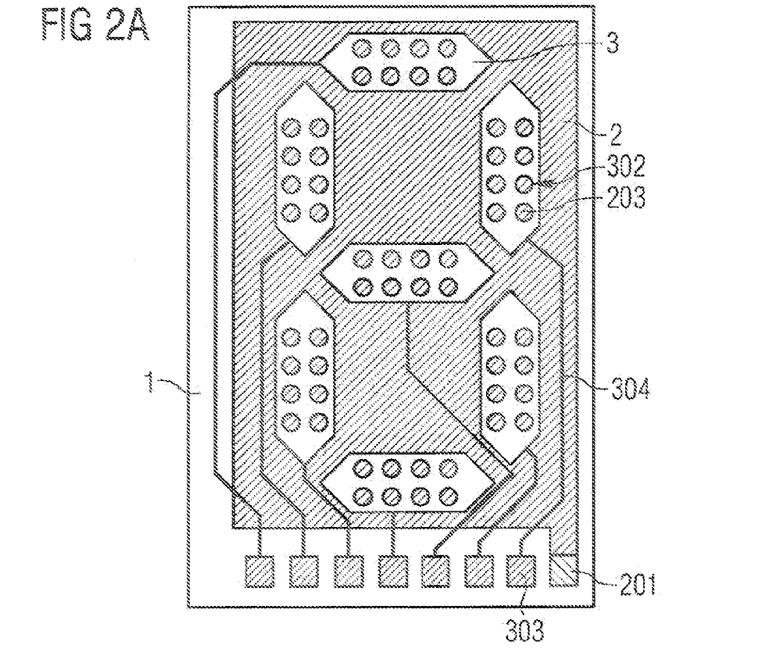
FIGS. 2A to 2C in each case show a schematic plan view of further example of a respective projection device.

In this example in FIG. 2A, the first contact layer 2 is in whole-area fashion. In particular, the first contact layer 2 extends virtually over the entire lateral extent of the semiconductor body 1.

The first Contact layer 2 has an electrical connection region 201. The connection region 201 is suitable for making electrical contact, with the semiconductor body 1 at the radiation exit side thereof.

The second contact layer 3 is structured in the form of pixels 301. In the example in FIG. 2A, the pixels 301 of the second contact layer 3 are arranged in a two-dimensional seven-segment display. A seven-segment display is suitable, in particular, for representing numbers from 0 to 9.

The second contact layer 3 in the example in FIG. 2A is, as illustrated in the example in FIG. 1, arranged between the first contact layer 2 and the semiconductor body 1.

Figure 2B:
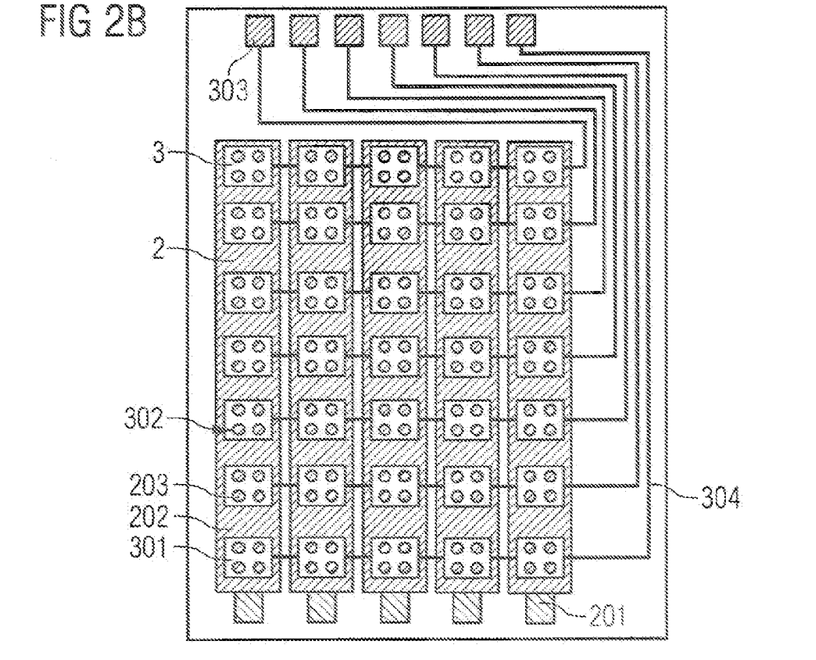
Figure 2C:
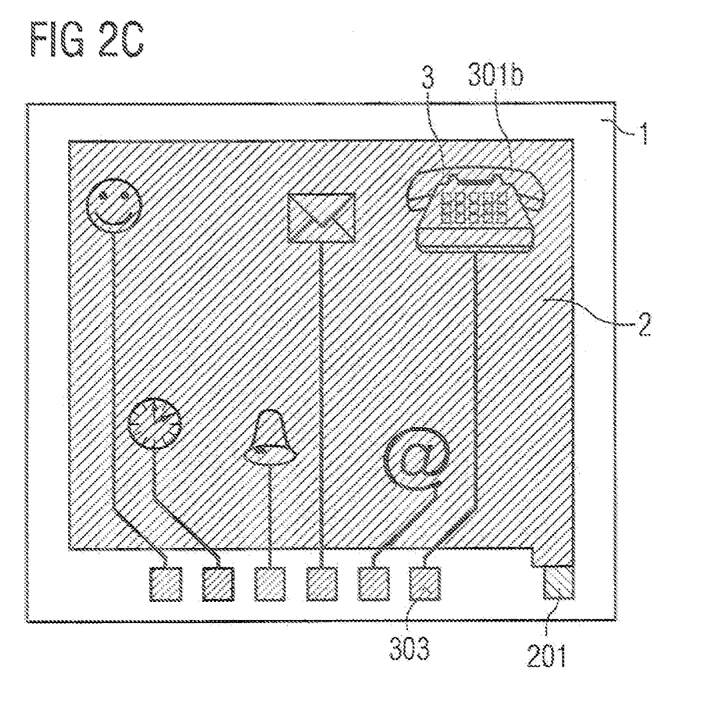

For the sake of clarity, in each of the examples in FIGS. 2A to 2C, the arrangement of the first contact layer 2, the second contact layer 3 and the semiconductor body 1 is illustrated such that, in particular, the second contact layer 3 is shown.

The second contact layer 3 has a plurality of electrical connection pads 303. In this example, the second contact layer 3 has seven electrical connection pads 303. A pixel 301 of the second contact layer 3 is in each case electrically conductively connected to a connection pad 303. In particular, each pixel 301 is connected to a respective electrical connection pad 303 separately via a conductor track 304 arranged below the pixels 301.

Partial regions 203 of the first contact layer 2 are led through openings 302 in the second contact layer 3. In particular, the partial regions 203 of the first contact layer 2 are led through the openings 302 in the second contact layer 3 in a manner electrically insulated from the second contact layer 3. As illustrated in FIG. 1, the partial regions 203 of the first contact layer 2 lead in an electrically insulated manner through openings in the second contact layer 3 and through perforations in the active layer 101.

For electrically insulating the first and second contact layers 2, 3 from one another, an electrically insulating separating layer is arranged between the first contact layer 2 and the second contact layer 3 (not illustrated).

The first contact layer 2 has an electrical connection region 201 for the purpose of making electrical contact.

Alternatively, there is the possibility that the first contact layer 2 does not have such an electrically conductive connection region 201, but rather is directly electrically conductively connected to an electrically conductive carrier (not illustrated). Such a carrier therefore makes it possible to make contact with the contact layer 2 from the rear side 103.

FIG. 2B shows a further longitudinal section of an example of a projection device. In this example, the first contact layer 2 is structured in the form of structures 202, in particular in strip-shaped fashion. Accordingly, the first contact layer 2 is not formed in whole-area fashion, but rather has structures 202 electrically insulated from one another.

Furthermore, the first contact layer 2 has a plurality of electrical connection regions 201. A structure 202 of the first contact layer 2 is in each case electrically conductively connected to an electrical connection region 201. Consequently, the structures 202 of the first contact layer 2 can be electrically driven separately from one another in each case via an electrical connection region 201.

The second contact layer 3 is structured in the form of pixels 301, wherein the pixels 301 are arranged in a two-dimensional regular matrix composed of n rows and m columns. The pixels 301 are arranged, in particular, on the strip-shaped structures 202 of the first contact layer 2. In particular, the pixels 301 which are in each case situated in a common series are electrically conductively connected to an electrically conductive connection pad 303 jointly Via a respective conductor track 304. In particular, the second contact layer 3 has h electrical connection pads 303 in the case of a matrix arrangement of the pixels 301 comprising n rows. By virtue of the fact that the pixels 301 are electrically conductively connected in rows separately in each case to an electrical connection pad 303 of the second contact layer and in columns separately to a respective electrical connection region 201 of the first contact layer 2, each pixel 301 can be electrically driven separately.

If, by way of example, only one column of the first contact layer 2 and only one row of the second contact layer 3 is driven in an electrically conductive manner, then electrical contact is made with only one pixel 301. An interconnection of pixels 301 that can be individually electrically driven by one another on the rear side of the semiconductor body 1 is thereby made possible. By corresponding driving of the individual pixels 301 on the semiconductor body 1, differently luminous images such as, for example, pictograms, letters and/or letterings can thus be generated and imaged onto a closely positioned projection area by a lens or a lens system. A projection device which can project flexible images is advantageously made possible.

As in the example with regard to FIG. 2A, partial regions 203 of the first contact layer 2 lead in an electrically insulated manner through the second contact layer 3 and through the semiconductor body to the radiation exit side of the semiconductor body 1.

FIG. 2C shows a further example of a projection device.

As in the example with regard to FIG. 2A, in this example in FIG. 2C, the first contact layer 2 is a whole-area arrangement. In contrast to the example in FIG. 2A, the second contact layer 3 has structures 301b in each case in the form of a pictogram or character. A structure 301b is in each case electrically conductively connected to an electrical connection pad 303 of the second contact layer 3 via a respective conductor track 304. Consequently, each structure 301b of the second contact layer 3 can be electrically driven separately.

The arrangement of the electrical connection pads 303 at the rear side of the semiconductor body 1 affords the advantage that, as a result, a plurality of semiconductor bodies 1 can be arranged closely alongside one another and the projection of a plurality of characters, character strings or letterings is thus made possible. In this case, it is possible to use a separate lens system or a separate lens per semiconductor body 1 or a common lens system or a common lens for all the semiconductor bodies 1.

Figure 3:
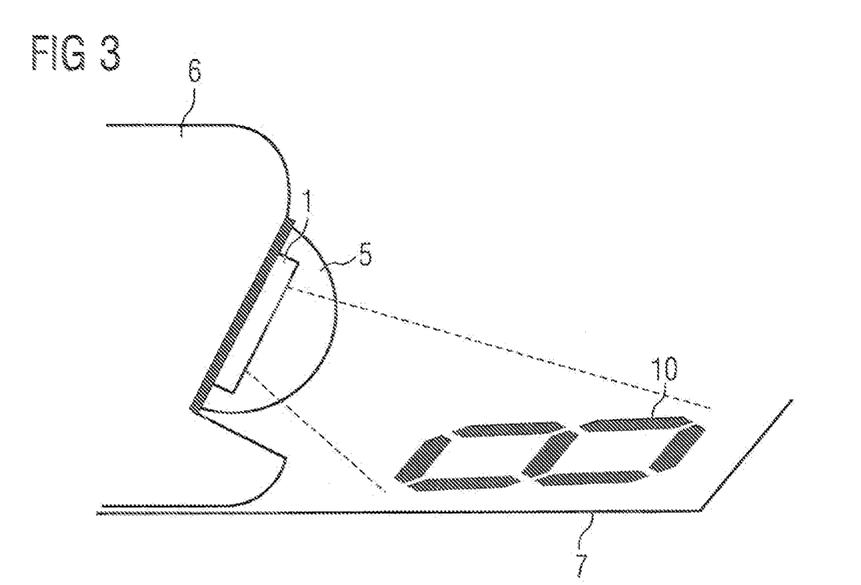
FIG. 3 shows a schematic cross section of an example of ah electronic component with a projection device arranged therein.

The example in FIG. 3 illustrates a projection device exhibiting a semiconductor body 1, an optical element 5 and a projection area 7. The projection device in the example in FIG. 3 is part of an electronic component 6, for example of a mobile telephone, laptop, PDA, computer, clock or alarm clock. The electronic component 6 is preferably a portable component.

The projection area 7 can be part of the electronic component 6, for example can be formed by a housing part of the component, or can lie outside the component 6, for example can be formed by a table or a wall. The projection device integrated in the electronic component can advantageously project light in specific images, such as, for example pictograms, letters and/or letterings, onto closely situated areas.

The lens system or the lens 5 intended for projecting the light emitted by the semiconductor body 1 onto a projection area 7 can consist of one or more lenses, each preferably having one or two curved areas. In this case, the lens system or the lens 5 can be fixed directly on the semiconductor body 1 or be held at a defined distance from the semiconductor body 1 by an outer frame. In this case, the lens system or the lens 5 can be shaped such that, depending on the desired application, an image true to scale of the emitted light pattern appears on a planar or curved area perpendicularly, parallel or diagonally with respect to the light exit side of the semiconductor body 1. The projection area 7 can lie within the electronic component 6 by back projection or outside the component. A miniaturized projection device which can be used flexibly and can project different images is advantageously made possible in this way.

Our devices are not restricted to the examples by the description oh the basis thereof, but rather encompass any novel feature and also any combination of features, which in particular includes any combination of features in the appended claims, even if the feature or combination itself is not explicitly specified in the claims or examples.

The invention claimed is:

1. An optoelectronic projection device which generates a predefined image during operation, comprising a semiconductor body having an active layer that generates electromagnetic radiation and a radiation exit side and is an imaging element of the projection device, wherein to electrically contact the semiconductor body, a first contact layer and a second contact layer are arranged at a rear side of the semiconductor body, the rear side lying opposite the radiation exit side, and are electrically insulated from one another by a separating layer, partial regions of the first contact layer are led through openings in the second contact layer and through the active layer in a direction toward the radiation exit side, the semiconductor body is structured to form a pattern so that only a part of the semiconductor body is removed in first areas, the first are located between radiation emitting second areas and the pattern is generated during operation of the projection device by the radiation emitting second areas, the second contact layer is in the form of pixels, and at least one part of the predefined image arises as a result of projection of at least part of the pixels and of at least part of the pattern during operation of the projection device.

2. The optoelectronic projection device according to claim 1, wherein the pixels are arranged in a two-dimensional segment display.

3. The optoelectronic projection device according to claim 1, wherein the pixels are arranged in a two-dimensional regular matrix composed of n rows and m columns.

4. The optoelectronic projection device according to claim 1, wherein the first contact layer is arranged at a side of the second contact layer remote from the semiconductor body, the second contact layer has a plurality of openings, and the first contact layer runs through the openings to the semiconductor body.

5. The optoelectronic projection device according to claim 1, wherein a partial region of the first contact layer extends from the rear side through a perforation in the active layer in a direction toward the radiation exit side.

6. The optoelectronic projection device according to claim 1, wherein the first contact layer has at least one electrical connection region that electrically contacts the semiconductor body at a side of the active layer which faces the radiation exit side.

7. The optoelectronic projection device according to claim 1, wherein the first contact layer has a plurality of electrical connection regions electrically conductively connected to a connection region.

8. The optoelectronic projection device according to claim 1, wherein the second contact layer is in the form of pixels and has a plurality of electrical connection pads, wherein a pixel is in each case electrically conductively connected to a connection pad.

9. The optoelectronic projection device according to claim 1, wherein radiation coupling-out structures are arranged in regions on the radiation exit side.

10. The optoelectronic projection device according to claim 1, wherein an optical element is disposed downstream of the semiconductor body on the radiation exit side.

11. The optoelectronic projection device according to claim 1, wherein the first and/or the second contact layer reflect(s) part of the electromagnetic radiation, said part being emitted from the active layer in a direction toward the rear side and in a direction of the radiation exit side.

12. The optoelectronic projection device according to claim 1, wherein the projection device is part of an electronic component selected from the group consisting of a mobile telephone, PDA, laptop, computer, clock and alarm clock.

13. A method of producing an optoelectronic projection device that generates a predefined image during operation comprising:
providing a single semiconductor body having an active layer that generates electromagnetic radiation and a radiation exit side and is an imaging element of the projection device,
applying a first contact layer and a second contact layer at a rear side of the semiconductor body, the rear side lying opposite the radiation exit side, the first and second contact layers are electrically insulated from one another by separating layer and are adapted to electrically contact the semiconductor body, and
structuring the semiconductor body to form a pattern for the predefined image so that at least a part of the semiconductor body is removed in first areas, the structuring by etching and lithography,
wherein
the first areas are located between radiation emitting second areas and the pattern is generated during operation of the projection device by the radiation emitting second areas,
partial regions of the first contact layer are led through openings in the second contact layer and through the active layer in a direction towards the radiation exit side,
the second contact layer is in the form of pixels, and
at least one part of the predefined image arises as a result of projection of at least part of the pixels and of at least part of the pattern during operation of the projection device.

14. the method accordingly to claim 13, wherein the semiconductor body is completely removed in the first areas such that in the first areas electrically insulating regions of the second contact layer arranged between the pixels are not covered with the semiconductor body, radiation coupling-out structures are arranged on the radiation exit side in the second areas below which the pixels of the second contact layer are arranged in a vertical direction, and the active layer of the semiconductor body comprises InGaAlP or InGaN.

* * * * *

UNITED STATES PATENT AND TRADEMARK OFFICE
CERTIFICATE OF CORRECTION

PATENT NO.       : 8,716,724 B2
APPLICATION NO.  : 13/127328
DATED            : May 6, 2014
INVENTOR(S)      : von Malm et al.

Page 1 of 1

It is certified that error appears in the above-identified patent and that said Letters Patent is hereby corrected as shown below:

In the Claims

<u>In Column 14</u>

Claim 1, at line 63, please change "the first are" to -- the first areas are --.

<u>In Column 16</u>

Claim 14, at line 36, please change "the method" to -- The method --.

Signed and Sealed this
Twelfth Day of August, 2014

Michelle K. Lee
*Deputy Director of the United States Patent and Trademark Office*